US012604582B2

(12) United States Patent
Chen

(10) Patent No.: US 12,604,582 B2
(45) Date of Patent: Apr. 14, 2026

(54) DISPLAY PANEL AND MOBILE TERMINAL

(71) Applicant: GUANGZHOU CHINA STAR OPTOELECTRONICS SEMICONDUCTOR DISPLAY TECHNOLOGY CO., LTD., Guangzhou (CN)

(72) Inventor: Paijie Chen, Guangzhou (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 714 days.

(21) Appl. No.: 17/905,172

(22) PCT Filed: Jul. 28, 2022

(86) PCT No.: PCT/CN2022/108669
§ 371 (c)(1),
(2) Date: Aug. 28, 2022

(87) PCT Pub. No.: WO2024/011667
PCT Pub. Date: Jan. 18, 2024

(65) Prior Publication Data
US 2024/0204152 A1 Jun. 20, 2024

(30) Foreign Application Priority Data
Jul. 15, 2022 (CN) .......................... 202210836254.1

(51) Int. Cl.
*H10H 20/857* (2025.01)
*H01L 25/075* (2006.01)
*H10H 20/85* (2025.01)

(52) U.S. Cl.
CPC ....... *H10H 20/857* (2025.01); *H01L 25/0753* (2013.01); *H10H 20/8506* (2025.01)

(58) Field of Classification Search
CPC ............. H10H 20/857; H10H 20/8506; H10H 29/142; H01L 25/0753; G09F 9/33
See application file for complete search history.

(56) References Cited

U.S. PATENT DOCUMENTS

2016/0300988 A1* 10/2016 Oh .......................... H01L 24/29
2019/0355294 A1 11/2019 Gu et al.
(Continued)

FOREIGN PATENT DOCUMENTS

CN 107591470 A 1/2018
CN 109324444 A * 2/2019 ......... G02F 1/13452
(Continued)

OTHER PUBLICATIONS

Translation of CN-109324444-A (Year: 2019).*
(Continued)

*Primary Examiner* — Ratisha Mehta
*Assistant Examiner* — Thaddeus J Kolb
(74) *Attorney, Agent, or Firm* — PV IP PC; Christopher S. Ruprecht; Wei Te Chung

(57) ABSTRACT

The present disclosure provides a display panel and a mobile terminal. The display panel includes a base substrate, a pad assembly, a pin assembly, and a limit assembly. An end of the limit assembly is fixedly connected with the pad assembly, another end of the limit assembly extends towards a side close to the pin assembly along a direction perpendicular to the base substrate, and a thickness of the limit assembly is greater than a distance between the pin assembly and the pad assembly. A side surface of the limit assembly is abutted against the pin assembly to prevent the pin assembly from moving.

20 Claims, 3 Drawing Sheets

(56)          References Cited

U.S. PATENT DOCUMENTS

| | | | |
|---|---|---|---|
| 2021/0398954 A1 | 12/2021 | Gu et al. | |
| 2024/0177634 A1* | 5/2024 | Yue | H01L 25/0753 |
| 2024/0282737 A1* | 8/2024 | Sun | B23K 35/262 |

FOREIGN PATENT DOCUMENTS

| | | | | |
|---|---|---|---|---|
| CN | 112310267 A | | 2/2021 | |
| CN | 113345879 A | * | 9/2021 | |
| CN | 214898491 U | | 11/2021 | |
| CN | 114141804 A | | 3/2022 | |
| CN | 215988815 U | | 3/2022 | |
| WO | 2018059598 A1 | | 4/2018 | |
| WO | 2020035013 A1 | | 2/2020 | |
| WO | 2021236243 A1 | | 11/2021 | |
| WO | WO-2023122963 A1 | * | 7/2023 | H10H 20/857 |

OTHER PUBLICATIONS

Translation of WO-2023122963-A1 (Year: 2023).*
International Search Report in International application No. PCT/CN2022/108669, mailed on Nov. 30, 2022.
Written Opinion of the International Search Authority in International application No. PCT/CN2022/108669, mailed on Nov. 30, 2022.
Chinese Office Action issued in corresponding Chinese Patent Application No. 202210836254.1 dated Sep. 26, 2025, pp. 1-6.

* cited by examiner $$20\begin{cases}21\\22\end{cases} \quad 30\begin{cases}31\\32\end{cases} \quad 40\begin{cases}41\\42\end{cases} \quad 60\begin{cases}61\\62\end{cases}$$

fixedly connecting two ends of a light-emitting diode chip with a pin assembly, and defining holes on the pin assembly. — S10 forming a limit assembly on a base substrate provided with pad assembly. — S20 transferring a micro light-emitting diode chip to the base substrate to make the pin assembly be soldered with the pad assembly. — S30

DISPLAY PANEL AND MOBILE TERMINAL

FIELD OF INVENTION

The present disclosure relates to a field of display, and particularly relates to a display panel and a mobile terminal.

BACKGROUND OF INVENTION

Light-emitting diode (LED) is a new generation of display technology with self-luminous display characteristics and advantages of higher brightness, better luminous efficiency, and lower power consumption. Since LED display panels have self-luminous characteristics and no additional light sources are used, therefore, LED display panels may be manufactured thinner and lighter than display devices using separate light sources, and characteristics of flexible and foldable display are relatively easy to realize.

Generally, a LED chip in the LED display panel is needed to be solidly soldered onto pads on a surface of a substrate. During a process of soldering the LED chip and the pads, due to an influence of high temperature in a production line of surface assembly technology, the LED chip will have a certain fluidity, resulting in a displacement of a contact surface between pins of the LED chip and the pads, thereby resulting in a contact area being misplaced, causing poor soldering to occur, and affecting conductivity yield.

Therefore, a display panel and a mobile terminal are urgently needed to solve above-mentioned technical problems.

Technical Problems

The present disclosure provides a flexible display panel and a mobile terminal to improve a technical problem that a contact surface between pins of a LED chip and pads in an existing display panel is prone to displacement, resulting in poor soldering.

Technical Solutions

The present disclosure provides a display panel, the display panel includes a base substrate, a pad assembly arranged on the base substrate, and a light-emitting diode chip, both ends of the light-emitting diode chip are fixedly connected with a pin assembly, the pin assembly is soldered to the pad assembly;

wherein the display panel further includes a limit assembly arranged on the pad assembly, an end of the limit assembly is fixedly connected with the pad assembly, another end of the limit assembly extends towards a side close to the pin assembly along a direction perpendicular to the base substrate, and a thickness of the limit assembly is greater than a distance between the pin assembly and the pad assembly; a side surface of the limit assembly is abutted against the pin assembly to prevent the pin assembly from moving along a first direction and a second direction, the first direction intersects with the second direction, and both the first direction and the second direction are parallel to a surface of the base substrate in contact with the pad assembly.

In the display panel provided by an embodiment of the present disclosure, the pad assembly includes a first pad and a second pad insulated from each other, the pin assembly includes a first pin located at an end of the light-emitting diode chip, and a second pin located at another end of the light-emitting diode chip, the first pin is soldered to the first pad, and the second pin is soldered to the second pad;

wherein the limit assembly includes a first limited member arranged on the first pad, and a second limited member arranged on the second pad, the first limited member is fixedly connected with the first pin, and the second limited member is fixedly connected with the second pin.

In the display panel provided by an embodiment of the present disclosure, the first pin is defined with at least one first through hole, the second pin is defined with at least one second through hole; and wherein the first limited member includes at least one first limited sub-member, an end of the first limited sub-member corresponds to the first through hole and is arranged in the first through hole; the second limited member includes at least one second limited sub-member, an end of the second limited sub-member corresponds to the second through hole and is arranged in the second through hole.

In the display panel provided by an embodiment of the present disclosure, in a direction of a plan view of the display panel, an orthographic projection of the first limited sub-member on the first pad and an orthographic projection of the light-emitting diode chip on the first pad are misaligned; an orthographic projection of the second limited sub-member on the second pad and an orthographic projection of the light-emitting diode chip on the second pad are misaligned.

In the display panel provided by an embodiment of the present disclosure, the display panel further includes a solder paste layer, the solder paste layer includes a first solder paste layer located between the first pin and the first pad, and a second solder paste layer located between the second pin and the second pad;

wherein the first limited member penetrates through the first solder paste layer and is in contact with the first pad, and the second limited member penetrates through the second solder paste layer and is in contact with the second pad.

In the display panel provided by an embodiment of the present disclosure, a sum of a thickness of the first solder paste layer and a thickness of the first pin is less than or equal to a thickness of the first limited member; a sum of a thickness of the second solder paste layer and a thickness of the second pin is less than or equal to a thickness of the second limited member.

In the display panel provided by an embodiment of the present disclosure, an area of the first through hole is 10% to 30% of an area corresponding to the first pin; and an area of the second through hole is 10% to 30% of an area corresponding to the second through hole.

In the display panel provided by an embodiment of the present disclosure, the first limited member includes a plurality of third limited sub-members, the plurality of third limited sub-members are arranged around the first pin, the second limited member includes a plurality of fourth limited sub-members, and the plurality of fourth limited sub-members are arranged around the second pin.

In the display panel provided by an embodiment of the present disclosure, an orthographic projection of the first pad on the light-emitting diode chip or an orthographic projection of the second pad on the light-emitting diode chip is located in the light-emitting diode chip.

In the display panel provided by an embodiment of the present disclosure, the light-emitting diode chip is any one of a mini light-emitting diode chip and a micro light-emitting diode chip.

The present disclosure provides a mobile terminal, including a terminal body and a display panel, the terminal body is integrated with the display panel, and the display panel includes a base substrate, a pad assembly arranged on the base substrate, and a light-emitting diode chip, both ends of the light-emitting diode chip are fixedly connected with a pin assembly, the pin assembly is soldered to the pad assembly;

wherein the display panel further includes a limit assembly arranged on the pad assembly, an end of the limit assembly is fixedly connected with the pad assembly, another end of the limit assembly extends towards a side close to the pin assembly along a direction perpendicular to the base substrate, and a thickness of the limit assembly is greater than a distance between the pin assembly and the pad assembly; a side surface of the limit assembly is abutted against the pin assembly to prevent the pin assembly from moving along a first direction and a second direction, the first direction intersects with the second direction, and both the first direction and the second direction are parallel to a surface of the base substrate in contact with the pad assembly.

In the mobile terminal provided by an embodiment of the present disclosure, the pad assembly includes a first pad and a second pad insulated from each other, the pin assembly includes a first pin located at an end of the light-emitting diode chip, and a second pin located at another end of the light-emitting diode chip, the first pin is soldered to the first pad, and the second pin is soldered to the second pad;

wherein the limit assembly includes a first limited member arranged on the first pad, and a second limited member arranged on the second pad, the first limited member is fixedly connected with the first pin, and the second limited member is fixedly connected with the second pin.

In the mobile terminal provided by an embodiment of the present disclosure, the first pin is defined with at least one first through hole, the second pin is defined with at least one second through hole; and wherein the first limited member includes at least one first limited sub-member, an end of the first limited sub-member corresponds to the first through hole and is arranged in the first through hole; the second limited member includes at least one second limited sub-member, an end of the second limited sub-member corresponds to the second through hole and is arranged in the second through hole.

In the mobile terminal provided by an embodiment of the present disclosure, in a direction of a plan view of the display panel, an orthographic projection of the first limited sub-member on the first pad and an orthographic projection of the light-emitting diode chip on the first pad are misaligned; an orthographic projection of the second limited sub-member on the second pad and an orthographic projection of the light-emitting diode chip on the second pad are misaligned.

In the mobile terminal provided by an embodiment of the present disclosure, the display panel further includes a solder paste layer, the solder paste layer includes a first solder paste layer located between the first pin and the first pad, and a second solder paste layer located between the second pin and the second pad;

wherein the first limited member penetrates through the first solder paste layer and is in contact with the first pad, and the second limited member penetrates through the second solder paste layer and is in contact with the second pad.

In the mobile terminal provided by an embodiment of the present disclosure, a sum of a thickness of the first solder paste layer and a thickness of the first pin is less than or equal to a thickness of the first limited member; a sum of a thickness of the second solder paste layer and a thickness of the second pin is less than or equal to a thickness of the second limited member.

In the mobile terminal provided by an embodiment of the present disclosure, an area of the first through hole is 10% to 30% of an area corresponding to the first pin; and an area of the second through hole is 10% to 30% of an area corresponding to the second through hole.

In the mobile terminal provided by an embodiment of the present disclosure, the first limited member includes a plurality of third limited sub-members, the plurality of the third limited sub-members are arranged around the first pin, the second limited member includes a plurality of fourth limited sub-members, and the plurality of the fourth limited sub-members are arranged around the second pin.

In the mobile terminal provided by an embodiment of the present disclosure, an orthographic projection of the first pad on the light-emitting diode chip or an orthographic projection of the second pad on the light-emitting diode chip is located in the light-emitting diode chip.

In the mobile terminal provided by an embodiment of the present disclosure, the light-emitting diode chip is any one of a mini light-emitting diode chip and a micro light-emitting diode chip.

Beneficial Effects

A display panel provided by the present disclosure is provided with a limit assembly arranged on a pad assembly, and an end of the limit assembly is fixedly connected with the pad assembly, another end of the limit assembly extends towards a side close to a pin assembly along a direction perpendicular to a base substrate, and a thickness of the limit assembly is greater than a distance between the pin assembly and the pad assembly. A side surface of the limit assembly is abutted against the pin assembly to prevent the pin assembly from moving, thereby preventing a phenomenon of a displacement of a contact surface between the pin assembly of a light-emitting diode chip and the pad assembly caused by a high temperature generated by manufacturing a solder paste layer during a process of soldering to the pad assembly, improving a soldering precision between the pin assembly and the pad assembly, and ensuring stability of die bonding and uniformity of arrangement of the light-emitting diode chip.

DETAILED DESCRIPTION OF EMBODIMENTS

Purposes and technical solutions of the present disclosure and the effects thereof will be described in detail in the following with reference to exemplary embodiments and the corresponding accompanying drawings. It should be understood that the specific embodiments described herein are merely for explaining the present disclosure, and the present disclosure is not limited thereto.

Due to an influence of high temperature in a production line of surface mount technology during a process of soldering a micro light-emitting diode (micro-LED) chip and pads, the micro-LED chip will have a certain fluidity, resulting in a displacement of a contact surface between pins of the micro-LED chip and the pads, thereby resulting in the contact surface being misaligned, causing poor soldering to occur, and affecting conductivity yield. The present disclosure provides following technical solutions to solve above technical problems.

Figure 1:
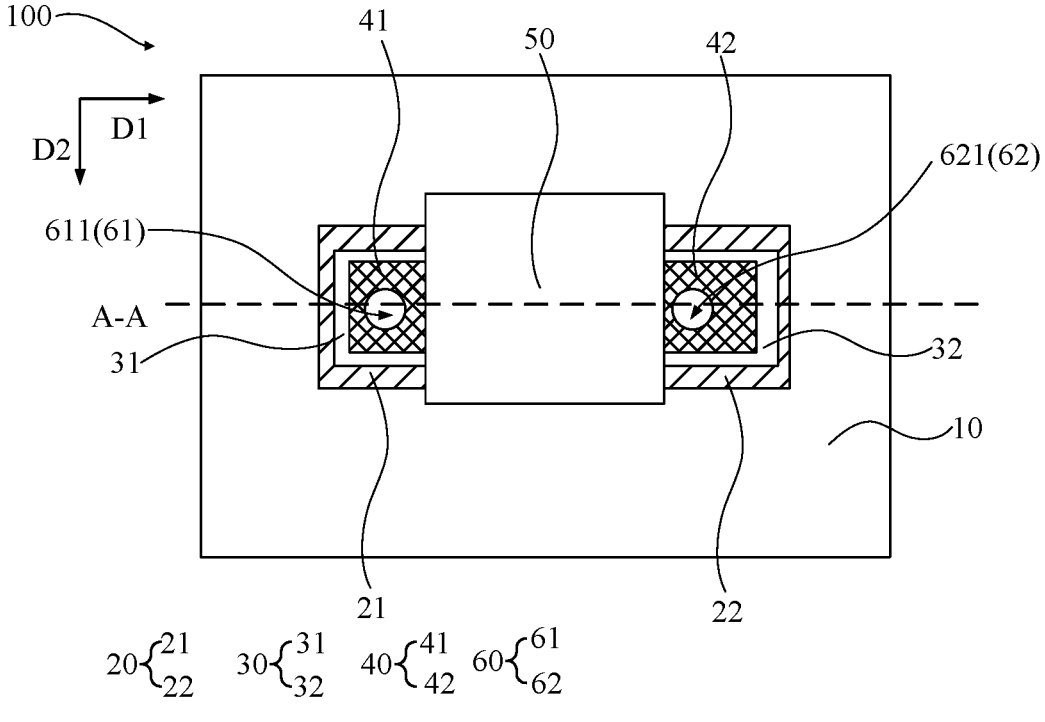
FIG. 1 is a plan view of a first display panel provided by an embodiment of the present disclosure.
Figure 2:
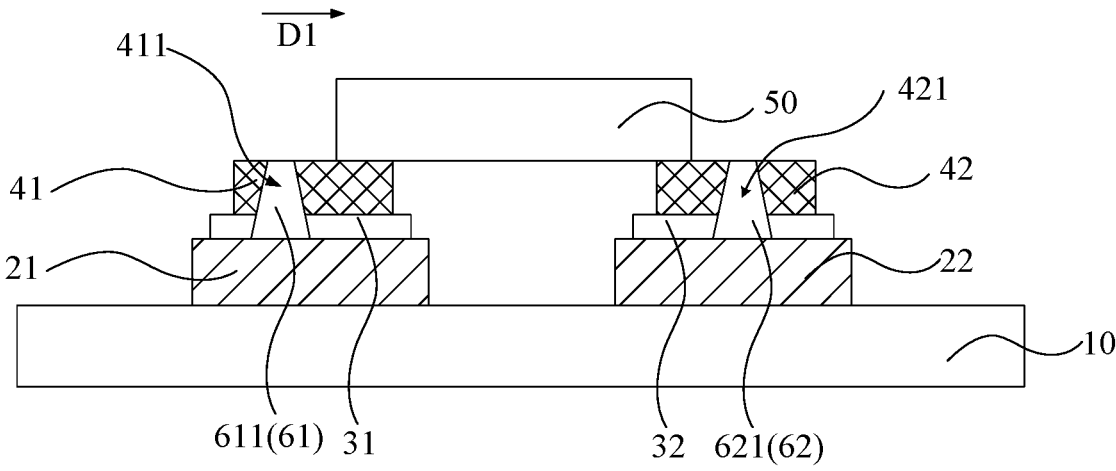
FIG. 2 is a cross-sectional view of the display panel at A-A in FIG. 1.
Figure 3:
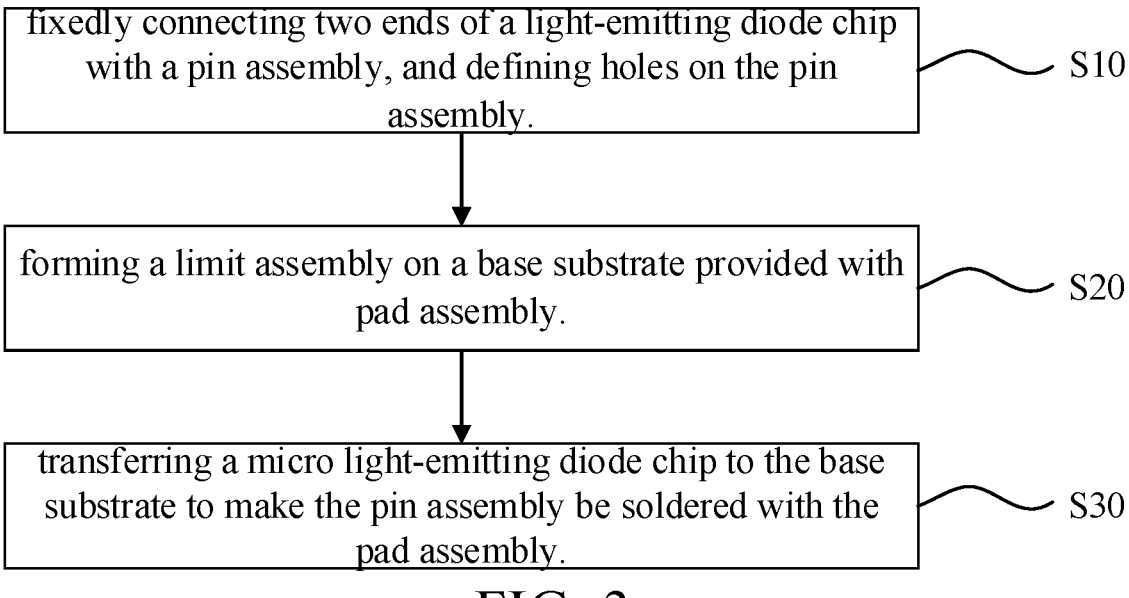
FIG. 3 is a flowchart of a method for manufacturing the first display panel provided by an embodiment of the present disclosure.

Referring to FIG. 1 to FIG. 3, the present disclosure provides a display panel 100, the display panel 100 includes a base substrate 10, a pad assembly 20 arranged on the base substrate 10, and a light-emitting diode chip 50. Both ends of the light-emitting diode chip 50 are fixedly connected with a pin assembly 40, the pin assembly 40 is soldered to the pad assembly 20.

Wherein the display panel 100 further includes a limit assembly 60, an end of the limit assembly 60 is fixedly connected with the pad assembly 20, another end of the limit assembly 60 extends towards a side close to the pin assembly 40 along a direction perpendicular to the base substrate 10, and a thickness of the limit assembly 60 is greater than a distance between the pin assembly 40 and the pad assembly 20. A side surface of the limit assembly 60 is abutted against the pin assembly 40 to prevent the pin assembly 40 from moving along a first direction D1 and a second direction D2. The first direction D1 intersects with the second direction D2, and both the first direction D1 and the second direction D2 are parallel to a surface of the base substrate 10 in contact with the pad assembly 20.

The display panel 100 provided by the present disclosure is provided with the limit assembly 60 arranged on the pad assembly 20, and the end of the limit assembly 60 is fixedly connected with the pad assembly 20, the another end of the limit assembly 60 extends towards the side close to the pin assembly 40 along the direction perpendicular to the base substrate 10, and the thickness of the limit assembly 60 is greater than the distance between the pin assembly 40 and the pad assembly 20. The side surface of the limit assembly 60 is abutted against the pin assembly 40 to prevent the pin assembly 40 from moving, thereby preventing a phenomenon of a displacement of a contact surface between the pin assembly 40 of the light-emitting diode chip 50 and the pad assembly 20 caused by a high temperature generated by manufacturing a solder paste layer 30 during a process of soldering to the pad assembly 20, improving a soldering precision between the pin assembly 40 and the pad assembly 20, and ensuring stability of die bonding and uniformity of arrangement of the light-emitting diode chip 50.

The technical solutions of the present disclosure will now be described with reference to specific embodiments.

Embodiment 1

FIG. 1 is a plan view of a first display panel provided by an embodiment of the present disclosure. FIG. 2 is a cross-sectional view of the display panel 100 at A-A in FIG. 1. Wherein the display panel 100 includes a base substrate 10, a pad assembly 20 arranged on the base substrate 10, and a light-emitting diode chip 50. Both ends of the light-emitting diode chip 50 are fixedly connected with a pin assembly 40, the pin assembly 40 is soldered to the pad assembly 20.

Wherein the display panel 100 further includes a limit assembly 60, an end of the limit assembly 60 is fixedly connected with the pad assembly 20, another end of the limit assembly 60 extends towards a side close to the pin assembly 40 along a direction perpendicular to the base substrate 10, and a thickness of the limit assembly 60 is greater than a distance between the pin assembly 40 and the pad assembly 20.

In the embodiment of the present disclosure, the another end of the limit assembly 60 is fixedly connected with the pin assembly 40, that is, a side surface of the limit assembly 60 is abutted against the pin assembly 40 to prevent the pin assembly 40 from moving along a first direction D1 and a second direction D2. The first direction D1 intersects with the second direction D2, and both the first direction D1 and the second direction D2 are parallel to a surface of the base substrate 10 in contact with the pad assembly 20.

Referring to FIG. 1 and FIG. 2, in the embodiment of the present disclosure, the pad assembly 20 includes a first pad 21 and a second pad 22 insulated from each other. The pin assembly 40 includes a first pin 41 located at an end of the light-emitting diode chip 50 and a second pin 42 located at another end of the light-emitting diode chip 50. The first pin 41 is soldered to the first pad 21, and the second pin 42 is soldered to the second pad 22.

Wherein the limit assembly 60 includes a first limited member 61 arranged on the first pad 21 and a second limited member 62 arranged on the second pad 22. The first limited member 61 is fixedly connected with the first pin 41, and the second limited member 62 is fixedly connected with the second pin 42.

In the embodiment of the present disclosure, the display panel 100 further includes a solder paste layer 30, the solder paste layer 30 includes a first solder paste layer 31 located between the first pin 41 and the first pad 21, and a second solder paste layer 32 located between the second pin 42 and the second pad 22.

Wherein the first limited member 61 penetrates through the first solder paste layer 31 and is in contact with the first pad 21, and the second limited member 62 penetrates through the second solder paste layer 32 and is in contact with the second pad 22.

Specifically, the first solder paste layer 31 is used to realize soldering of the first pin 41 to the first pad 21, and the second solder paste layer 32 is used to realize soldering of the second pin 42 to the second pad 22.

In an embodiment of the present disclosure, the light-emitting diode chip 50 is used to provide an area light source for a backlight module, the backlight module is applied to a liquid crystal display panel. The base substrate 10 may be used as a supporting substrate for the backlight module, and is generally composed of a polyimide thin film with a thickness of about 0.1 mm. A copper wire (not marked) and the pad assembly 20 are attached to the base substrate 10, and a thickness of the copper wire ranges from 10 μm to 15 μm. In an actual process, a thickness of the solder paste layer 30 on the pad assembly 20 ranges from 5 μm to 8 μm.

Specifically, a fluorescent film (not marked) encapsulated a whole surface is arranged above the light-emitting diode chip 50, the fluorescent film is attached above the light-emitting diode chip 50 and the base substrate 10 by hot pressing, and a thickness of the fluorescent film ranges from 200 μm to 300 μm.

Wherein when the light-emitting diode chip 50 is a backlight source, the light-emitting diode chip 50 is a mini light-emitting diode chip (mini-LED). Wherein the mini-LED chip refers to a LED chip with a size ranging from 50 μm to 200 μm.

Since the light-emitting diode chip 50 is used for the backlight source of the display panel 100, it is necessary to increase light-output efficiency of the backlight module. Therefore, a plurality of reflection bumps may be arranged on a side surface of the pad assembly 20 close to a light-emitting surface. A light extraction dot structure is formed by using the plurality of the reflection bumps, light is scattered to different angles by the light extraction dot structure to improve the light-output efficiency of the backlight module.

Specifically, a material of the reflective bumps is white reflective ink.

In another embodiment of the present disclosure, the light-emitting diode chip 50 is used as a light-emitting layer of the display panel 100. An array driving layer is further arranged between the base substrate 10 and the light-emitting diode chip 50, and the array driving layer may include a plurality of thin film transistors.

Specifically, the thin film transistors may be structures of an etching barrier type, a back channel etching type, a top gate thin film transistor type, etc., and are not limited in detail. For example, taking a top-gate thin film transistor as an example, the top-gate thin film transistor may include a buffer layer located on the base substrate 10, an active layer located on the buffer layer, a gate insulating layer located on the active layer, a gate electrode layer located on the gate insulating layer, an interlayer insulating layer located on the gate electrode layer, a source-drain electrode layer on the interlayer insulating layer, and a planarization layer on the source-drain electrode layer.

Specifically, the top-gate thin film transistor mentioned above is not limited to a single-gate structure, and may also be configured as a double-gate structure, etc. The active layer may be one of low-temperature polysilicon, indium gallium zinc oxide, or amorphous silicon.

In the embodiment of the present disclosure, the source-drain electrode layer is electrically connected with the first pin 41 of the light-emitting diode chip 50 by the first pad 21, and the second pad 22 is electrically connected with the second pin 42 of the light-emitting diode chip 50.

In the embodiment of the present disclosure, the first pin 41 is defined with at least one first through hole 411, and the second pin 42 is defined with at least one second through hole 421.

Wherein the first limited member 61 includes at least one first limited sub-member 611, an end of the first limited sub-member 611 corresponds to the first through hole 411 and is arranged in the first through hole 411. The second limited member 62 includes at least one second limited sub-member 621, an end of the second limited sub-member 621 corresponds to the second through hole 421 and is arranged in the second through hole 421.

In the embodiment of the present disclosure, the light-emitting diode chip 50 is any one of the mini-LED chip and a micro light-emitting diode chip (micro-LED). Wherein the micro-LED chip refers to a LED chip with a size less than 50 μm.

Since a size of the micro-LED chip is too small, it is difficult for those skilled in the present disclosure to design holes for the pin assembly 40 corresponding to the light-emitting diode chip 50. Therefore, the light-emitting diode chip 50 in the embodiment of the present disclosure is preferably the mini-LED chip.

The pin assembly 40 is designed with the holes in the above-mentioned design, and the limit assembly 60 is provided at a position of the pin assembly 40 corresponding to the pad assembly 20 to make the limit assembly 60 partially penetrates the pin assembly 40 or completely penetrates the pin assembly 40, and the light-emitting diode chip 50 is firmly fixed on the pad assembly 20, thereby preventing a phenomenon of a displacement of a contact surface between the pin assembly 40 and the pad assembly 20 caused by a high temperature generated by manufacturing the solder paste layer 30 during a process of soldering to the pad assembly 20, improving a soldering precision between the pin assembly 40 and the pad assembly 20, and ensuring stability of die bonding and uniformity of arrangement of the light-emitting diode chip 50.

Meanwhile, the light-emitting diode chip 50 is used for a self-luminous layer of the display panel 100, and a light reflectivity of a material of the pad assembly 20 needs to be reduced to avoid an influence of external stray light on display effect of the display panel 100.

Specifically, since it is difficult for the light-emitting diode chip 50 and the pad assembly 20 to be misaligned, therefore, an area of the pad assembly 20 may be reduced, thereby the light reflectivity of the material of the pad assembly 20 is reduced, and the display effect of the display panel 100 is further improved.

In the embodiment of the present disclosure, in a direction of a plan view of the display panel 100, an orthographic projection of the first limited sub-member 611 on the first pad 21 and an orthographic projection of the light-emitting diode chip 50 on the first pad 21 are misaligned. An orthographic projection of the second limited sub-member 621 on the second pad 22 and an orthographic projection of the light-emitting diode chip 50 on the second pad 22 are misaligned. The above-mentioned design may prevent the limit assembly 60 and the light-emitting diode chip 50 from contacting to avoid a poor contact between the light-emitting diode chip 50 and the limit assembly 60.

In the embodiment of the present disclosure, a sum of a thickness of the first solder paste layer 31 and a thickness of the first pin 41 is less than or equal to a thickness of the first limited member 61. A sum of a thickness of the second solder paste layer 32 and a thickness of the second pin 42 is less than or equal to a thickness of the second limited member 62.

This design may make the pin assembly 40 play a role in blocking an offset between the light-emitting diode chip 50 and the pin assembly 40 to ensure the stability of die bonding and the uniformity of arrangement of the light-emitting diode chip 50.

In the embodiment of the present disclosure, an area of the first through hole 411 is 10% to 30% of an area corresponding to the first pin 41. An area of the second through hole 421 is 10% to 30% of an area corresponding to the second pin 42. When the area of the first through hole 411 is less than 10% of the area corresponding to the first pin 41, or the area of the second through hole 421 is less than 10% of the area corresponding to the second pin 42, a purpose of restricting a movement of the pin assembly 40 is not served by the limit assembly 60. When the area of the first through hole 411 is greater than 30% of the area corresponding to the first pin 41, or the area of the second through hole 421 is greater than 30% of the area corresponding to the second pin 42, above-mentioned design makes a cross-sectional area of the limit assembly 60 too large, thereby reducing a cross-sectional area of the pin assembly 40, reducing a contact area between the pin assembly 40 and the pad assembly 20, and further making the pin assembly 40 and the pad assembly 20 prone to the poor contact.

In the embodiment of the present disclosure, an orthographic projection of the first pad 21 on the light-emitting diode chip 50 or an orthographic projection of the second pad 22 on the light-emitting diode chip 50 is located in the light-emitting diode chip 50. This is designed due to a presence of the limit assembly 60 to make the light-emitting diode chip 50 be firmly fixed on the pad assembly 20, therefore the orthographic projection of the first pad 21 on the light-emitting diode chip 50 or the second pad 22 on the light-emitting diode chip 50 is located in the light-emitting diode chip 50 to reduce the area of the pad assembly 20.

Since the pad assembly 20 is generally composed of a copper metal material, however, a reflectivity of the copper metal is higher, a cross-sectional area of the pad assembly 20 is reduced to decrease a reflectivity of external light irradiated to the pad assembly 20 and improve the display effect of the display panel 100.

In the embodiment of the present disclosure, dimensions and relative distances of the first pad 21 and the second pad 22 in each of the pad assemblies 20 may correspond to a distance between the first pin 41 and the second pin 42 connected on the light-emitting diode chip 50 to be fixed.

Wherein a number and arrangements of the pad assemblies 20 arranged on the base substrate 10 may be determined by a number and arrangements of the light-emitting diode chips 50 to be fixed and are not limited.

In the embodiment of the present disclosure, a shape of the first through hole 411 and a shape of the second through hole 421 may be a circle or a pattern with chamfers. A number of the holes on the first pad 21 or the second pad 22 may be one or more.

In the embodiment of the present disclosure, a shape of the first limited sub-member 611 or the second limited sub-member 621 is a trapezoid. Positions and a number of the first limited sub-members 611 correspond one-to-one with positions and a number of the holes of the first pin 41, and position and a number of the second limited sub-members 621 correspond one-to-one with positions and a number of the holes of the second pin 42.

Specifically, a material of the limit assembly 60 includes a photosensitive material or a magnetic material.

Referring to FIG. 3, FIG. 3 is a flowchart of a method for manufacturing the first display panel provided by an embodiment of the present disclosure. Wherein the method includes:

Step S10, fixedly connecting two ends of the light-emitting diode chip 50 with the pin assembly 40, and defining the holes on the pin assembly 40.

Specifically, the step S10 further includes:

Firstly, providing the light-emitting diode chip 50; then, fixedly connecting the first pin 41 to the end of the light-emitting diode chip 50, and fixedly connecting the second pin 42 to the another end of the light-emitting diode chip 50 at a same time; finally, defining the holes on the first pin 41 and the second pin 42 respectively to form the first through hole 411 in the first pin 41 and the second through hole 421 in the second pin 42 at the same time.

Step S20, forming the limit assembly 60 on the base substrate 10 provided with the pad assembly 20.

Specifically, the step S20 further includes:

Firstly, providing the base substrate 10; then, forming the pad assembly 20 on the base substrate 10, wherein the pad assembly 20 includes the first pad 21 and the second pad 22 insulated from each other and arranged separately; finally, forming the limit assembly 60 by coating a photosensitive material on the pad assembly 20, and exposing and developing the photosensitive material, wherein the limit assembly 60 includes the first limited member 61 arranged on the first pad 21 and the second limited member 62 arranged on the second pad 22.

Step S30, transferring the light-emitting diode chip 50 to the base substrate 10 to make the pin assembly 40 be soldered to the pad assembly 20.

Specifically, the step S30 further includes:

Firstly, transferring the light-emitting diode chip 50 to above the base substrate 10 to make the first pin 41 correspond to the first pad 21, and the second pin 42 correspond to the second pad 22 at the same time; then, moving the light-emitting diode chip 50 to make the first limited member 61 be sleeved in the first through hole 411, and the second limited member 62 be sleeved in the second through hole 421; finally, by a soldering process, soldering the first pin 41 to the first pad 21 and soldering the second pin 42 to the second pad 22 at the same time.

During a transfer process of the light-emitting diode chip 50, the holes on the pin assembly 40 is sleeved with the limit assembly 60 on the pad assembly 20 to make the light-emitting diode chip 50 be fixed on the pad assembly 20, therefore, the light-emitting diode chip 50 is effectively fixed, and a displacement problem of the light-emitting diode chip 50 caused by a flow of solder is prevented.

The method for manufacturing the display panel 100 provided by the embodiment of the present disclosure, the holes are defined in the pin assembly 40, and the limit assembly 60 is arranged on the pad assembly 20 corresponding to a position of the holes of the pin assembly 40, and the end of the limit assembly 60 is embedded in the position of the holes of the pin assembly 40, therefore the holes on the pin assembly 40 is sleeved with the limit assembly 60 on the pad assembly 20 to make the light-emitting diode chip 50 be fixed on the pad assembly 20, therefore, the light-emitting diode chip 50 is effectively fixed, and the displacement problem of the light-emitting diode chip 50 caused by the flow of solder is prevented.

In view of the technical problems that the contact surface between pins of the LED chip and the pads in an existing display panel is prone to displacement, resulting in poor soldering, the embodiment of the present disclosure provides the display panel 100, the display panel 100 includes the base substrate 10, the pad assembly 20 arranged on the base substrate 10, and the light-emitting diode chip 50. Both ends of the light-emitting diode chip 50 are fixedly connected with the pin assembly 40, the pin assembly 40 is soldered to the pad assembly 20. Wherein the display panel 100 further includes the limit assembly 60, the end of the limit assembly 60 is fixedly connected with the pad assembly 20, the another end of the limit assembly 60 is fixedly connected with the pin assembly 40. Wherein the pin assembly 40 is defined with the holes, and the end of the limit assembly 60 is arranged in the holes.

The display panel 100 provided by the present disclosure is provided with the limit assembly 60 arranged on the pad assembly 20, and the end of the limit assembly 60 is fixedly connected with the pad assembly 20, the another end of the limit assembly 60 is sleeved with the pin assembly 40 through the holes, thereby preventing the phenomenon of the displacement of the contact surface between the pin assembly 40 of the light-emitting diode chip 50 and the pad assembly 20 caused by the high temperature generated by manufacturing the solder paste layer 30 during the process of soldering to the pad assembly 20, improving the soldering precision between the pin assembly 40 and the pad assembly 20, and ensuring the stability of die bonding and the uniformity of arrangement of the light-emitting diode chip 50.

Embodiment 2

Figure 4:
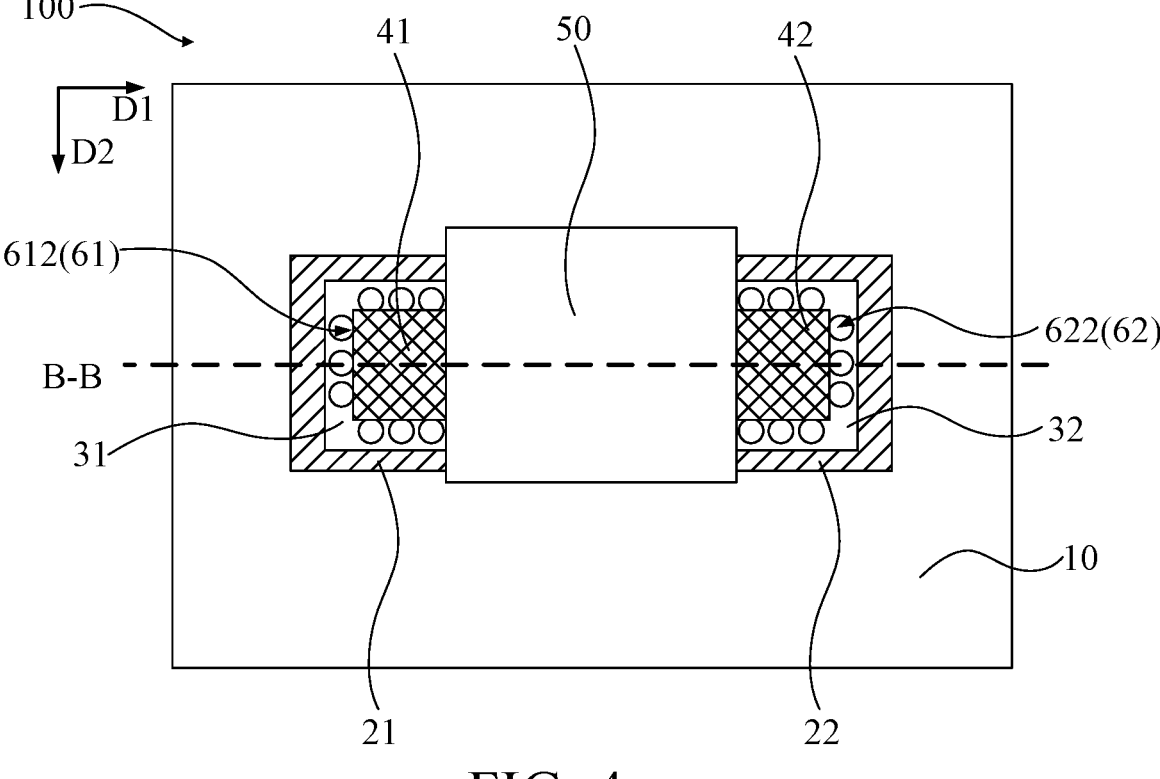
FIG. 4 is a plan-view of a second display panel provided by an embodiment of the present disclosure.
Figure 5:
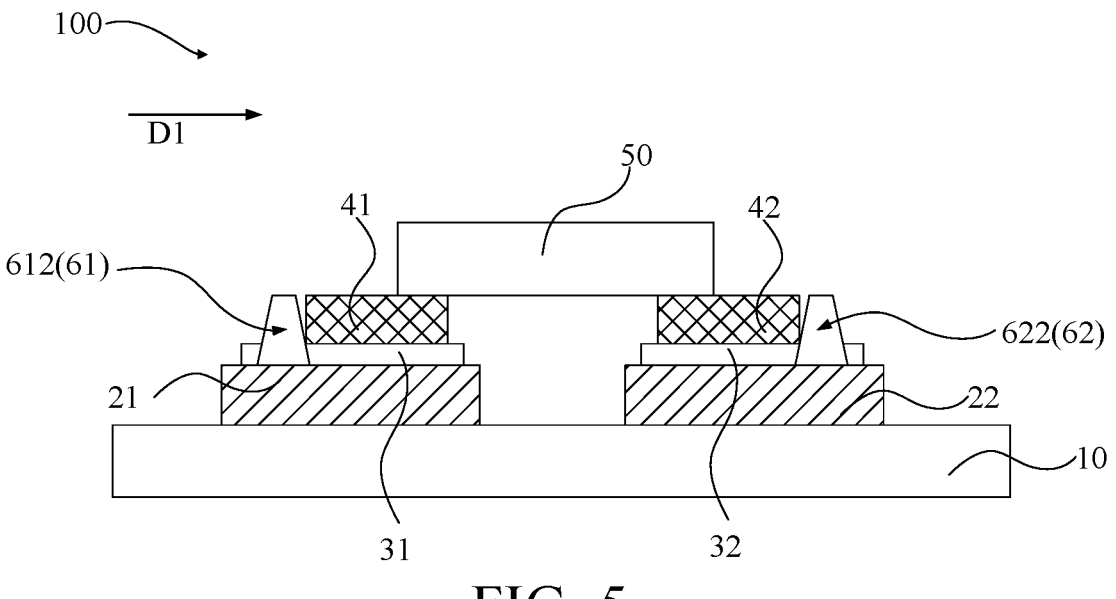
FIG. 5 is a cross-sectional view of the display panel at B-B in FIG. 4.

FIG. 4 is a plan view of a second display panel provided by an embodiment of the present disclosure. FIG. 5 is a cross-sectional view of the display panel at B-B in FIG. 4. A structure of a display panel 100 in embodiment 2 of the present disclosure is mostly same as a structure of the display panel 100 in embodiment 1 of the present disclosure, and only differs in that the first limited member 61 includes a plurality of third limited sub-members 612, the plurality of the third limited sub-members 612 are arranged around the first pin 41. The second limited member 612 includes a plurality of fourth limited sub-members 622, and the plurality of the fourth limited sub-members 622 are arranged around the second pin 42.

Compared with embodiment 1 of the present disclosure, in embodiment 2 of the present disclosure, the plurality of the third limited sub-members 612 are arranged around the first pin 41, and the plurality of the fourth limited sub-members 622 are arranged around the second pin 42 at the same time, and the side surface of the limit assembly 60 is abutted against the pin assembly 40 to prevent the pin assembly 40 from moving along the first direction D1 and the second direction D2, the first direction D1 intersects with the second direction D2, and both the first direction D1 and the second direction D2 are parallel to the surface of the base substrate 10 in contact with the pad assembly 20. The above-mentioned design may prevent the holes being defined in the first pin 41 or the second pin 42, thereby saving cost for a mask for a process of making the holes, and further saves a production cost of the display panel 100.

In the embodiment of the present disclosure, when the light-emitting diode chip 50 is used for the backlight source of the display panel 100, the light-emitting diode chip 50 is the mini-LED chip. When the light-emitting diode chip 50 is used for the self-luminous layer, the light-emitting diode chip 50 is any one of the mini-LED chip and the micro-LED chip.

Accordingly, the present disclosure further provides a mobile terminal, the mobile terminal includes a terminal body and the above-mentioned display panel 100, the terminal body is integrated with the display panel 100. A working principle of the mobile terminal is similar to a working principle of the display panel 100. The mobile terminal may include but is not limited to mobile phones, tablet computers, computer displays, game consoles, televisions, display screens, wearable devices, and other household appliances or household appliances with display functions.

The present disclosure provides the display panel 100 and the mobile terminal. The display panel 100 includes the base substrate 10, the pad assembly 20 arranged on the base substrate 10, and the light-emitting diode chip 50. Both ends of the light-emitting diode chip 50 are fixedly connected with the pin assembly 40, and the pin assembly 40 is soldered to the pad assembly 20. Wherein the display panel 100 further includes the limit assembly 60, the end of the limit assembly 60 is fixedly connected with the pad assembly 20, the another end of the limit assembly 60 extends towards the side close to the pin assembly 40 along the direction perpendicular to the base substrate 10, and the thickness of the limit assembly 60 is greater than the distance between the pin assembly 40 and the pad assembly 20. The display panel 100 provided by the present disclosure is provided with the limit assembly 60 arranged on a pad assembly 20, and the end of the limit assembly 60 is fixedly connected with the pad assembly 20, the another end of the limit assembly 60 extends towards the side close to the pin assembly 40 along the direction perpendicular to the base substrate 10, and the thickness of the limit assembly 60 is greater than the distance between the pin assembly 40 and the pad assembly 20. The side surface of the limit assembly 60 is abutted against the pin assembly 40 to prevent the pin assembly 40 from moving in the first direction D1 and the second direction D2, thereby preventing the phenomenon of the displacement of the contact surface between the pin assembly 40 of the light-emitting diode chip 50 and the pad assembly 20 caused by the high temperature generated by the manufacturing of the solder paste layer 30 during the process of soldering to the pad assembly 20, improving the soldering precision between the pin assembly 40 and the pad assembly 20, and ensuring the stability of die bonding and the uniformity of arrangement of the light-emitting diode chip 50.

In the foregoing embodiments, the description of each of the embodiments has respective focuses. For a part that is not described in detail in an embodiment, reference may be made to relevant descriptions in other embodiments.

It can be understood that, for those skilled in the art, equivalent replacements and modifications can be made according to the technical solution and disclosure ideas thereof of the present disclosure, and all these modifications or replacements are considered within the protection scope of the attached claims of the present disclosure.

What is claimed is:

1. A display panel, comprising:
   a base substrate;
   a pad assembly arranged on the base substrate; and
   a light-emitting diode chip, wherein both ends of the light-emitting diode chip are fixedly connected with a pin assembly, the pin assembly is soldered to the pad assembly;
   wherein the display panel further comprises a limit assembly arranged on the pad assembly, the limit assembly is in a shape of a post, an end of the limit assembly is in contact with and fixedly connected with the pad assembly, another end of the limit assembly extends towards a side close to the pin assembly along a direction perpendicular to the base substrate, and a thickness of the limit assembly is greater than a distance between the pin assembly and the pad assembly; a side surface of the limit assembly is abutted against the pin assembly to prevent the pin assembly from moving along a first direction and a second direction, the first direction intersects with the second direction, and both the first direction and the second direction are parallel to a surface of the base substrate in contact with the pad assembly.

2. The display panel as claimed in claim 1, wherein the pad assembly comprises a first pad and a second pad insulated from each other, the pin assembly comprises a first pin located at an end of the light-emitting diode chip, and a second pin located at another end of the light-emitting diode chip, the first pin is soldered to the first pad, and the second pin is soldered to the second pad;

wherein the limit assembly comprises a first limited member arranged on the first pad, and a second limited member arranged on the second pad, the first limited member is fixedly connected with the first pin, and the second limited member is fixedly connected with the second pin.

3. The display panel as claimed in claim 2, wherein the first pin is defined with at least one first through hole, the second pin is defined with at least one second through hole; and wherein an end of the first limited member corresponds to the first through hole and is arranged in the first through hole; an end of the second limited member corresponds to the second through hole and is arranged in the second through hole.

4. The display panel as claimed in claim 3, wherein in a direction of a plan view of the display panel, an orthographic projection of the first limited member on the first pad and an orthographic projection of the light-emitting diode chip on the first pad are misaligned; an orthographic projection of the second limited member on the second pad and an orthographic projection of the light-emitting diode chip on the second pad are misaligned.

5. The display panel as claimed in claim 3, wherein the display panel further comprises a solder paste layer, the solder paste layer comprises a first solder paste layer located between the first pin and the first pad, and a second solder paste layer located between the second pin and the second pad;

wherein the first limited member penetrates through the first solder paste layer and is in contact with the first pad, and the second limited member penetrates through the second solder paste layer and is in contact with the second pad.

6. The display panel as claimed in claim 5, wherein a sum of a thickness of the first solder paste layer and a thickness of the first pin is less than or equal to a thickness of the first limited member; a sum of a thickness of the second solder paste layer and a thickness of the second pin is less than or equal to a thickness of the second limited member.

7. The display panel as claimed in claim 3, wherein an area of the first through hole is 10% to 30% of an area corresponding to the first pin; and an area of the second through hole is 10% to 30% of an area corresponding to the second pin.

8. The display panel as claimed in claim 2, wherein the first limited member comprises a plurality of third limited sub-members, the plurality of the third limited sub-members are arranged around the first pin, the second limited member comprises a plurality of fourth limited sub-members, and the plurality of the fourth limited sub-members are arranged around the second pin.

9. The display panel as claimed in claim 2, wherein an orthographic projection of the first pad on the light-emitting diode chip or an orthographic projection of the second pad on the light-emitting diode chip is located in the light-emitting diode chip.

10. The display panel as claimed in claim 1, wherein the light-emitting diode chip is any one of a mini light-emitting diode chip and a micro light-emitting diode chip.

11. A mobile terminal, comprising a terminal body and a display panel, wherein the terminal body is integrated with the display panel, and the display panel comprises:

a base substrate;

a pad assembly arranged on the base substrate; and a light-emitting diode chip, wherein both ends of the light-emitting diode chip are fixedly connected with a pin assembly, the pin assembly is soldered to the pad assembly;

wherein the display panel further comprises a limit assembly arranged on the pad assembly, the limit assembly is in a shape of a post, an end of the limit assembly is in contact with and fixedly connected with the pad assembly, another end of the limit assembly extends towards a side close to the pin assembly along a direction perpendicular to the base substrate, and a thickness of the limit assembly is greater than a distance between the pin assembly and the pad assembly; a side surface of the limit assembly is abutted against the pin assembly to prevent the pin assembly from moving along a first direction and a second direction, the first direction intersects with the second direction, and both the first direction and the second direction are parallel to a surface of the base substrate in contact with the pad assembly.

12. The mobile terminal as claimed in claim 11, wherein the pad assembly comprises a first pad and a second pad insulated from each other, the pin assembly comprises a first pin located at an end of the light-emitting diode chip, and a second pin located at another end of the light-emitting diode chip, the first pin is soldered to the first pad, and the second pin is soldered to the second pad;

wherein the limit assembly comprises a first limited member arranged on the first pad, and a second limited member arranged on the second pad, the first limited member is fixedly connected with the first pin, and the second limited member is fixedly connected with the second pin.

13. The mobile terminal as claimed in claim 12, wherein the first pin is defined with at least one first through hole, the second pin is defined with at least one second through hole; and wherein an end of the first limited member corresponds to the first through hole and is arranged in the first through hole; an end of the second limited member corresponds to the second through hole and is arranged in the second through hole.

14. The mobile terminal as claimed in claim 13, wherein in a direction of a plan view of the display panel, an orthographic projection of the first limited member on the first pad and an orthographic projection of the light-emitting diode chip on the first pad are misaligned; an orthographic projection of the second limited member on the second pad and an orthographic projection of the light-emitting diode chip on the second pad are misaligned.

15. The mobile terminal as claimed in claim 13, wherein the display panel further comprises a solder paste layer, the solder paste layer comprises a first solder paste layer located between the first pin and the first pad, and a second solder paste layer located between the second pin and the second pad;

wherein the first limited member penetrates through the first solder paste layer and is in contact with the first pad, and the second limited member penetrates through the second solder paste layer and is in contact with the second pad.

16. The mobile terminal as claimed in claim 15, wherein a sum of a thickness of the first solder paste layer and a thickness of the first pin is less than or equal to a thickness of the first limited member; a sum of a thickness of the second solder paste layer and a thickness of the second pin is less than or equal to a thickness of the second limited member.

17. The mobile terminal as claimed in claim 13, wherein an area of the first through hole is 10% to 30% of an area corresponding to the first pin; and an area of the second through hole is 10% to 30% of an area corresponding to the second pin.

18. The mobile terminal as claimed in claim 12, wherein the first limited member comprises a plurality of third limited sub-members, the plurality of the third limited sub-members are arranged around the first pin, the second limited member comprises a plurality of fourth limited sub-members, and the plurality of the fourth limited sub-members are arranged around the second pin.

19. The mobile terminal as claimed in claim 12, wherein an orthographic projection of the first pad on the light-emitting diode chip or an orthographic projection of the second pad on the light-emitting diode chip is located in the light-emitting diode chip.

20. The mobile terminal as claimed in claim 11, wherein the light-emitting diode chip is any one of a mini light-emitting diode chip and a micro light-emitting diode chip.

\*   \*   \*   \*   \*